United States Patent [19]

Ryan

[11] Patent Number: 4,965,547

[45] Date of Patent: Oct. 23, 1990

[54] SIGNAL CONVERTER CIRCUIT

[75] Inventor: Rodger Ryan, San Jose, Calif.

[73] Assignee: General Electric Company, King of Prussia, Pa.

[21] Appl. No.: 363,829

[22] Filed: Jun. 9, 1989

[51] Int. Cl.$^5$ .............................................. G08C 19/06
[52] U.S. Cl. ........................... 340/870.350; 307/310; 307/304; 328/3
[58] Field of Search ................. 340/870.35; 307/310, 307/304; 328/3; 374/10, 178

[56] References Cited

U.S. PATENT DOCUMENTS

| | | | |
|---|---|---|---|
| 2,473,457 | 6/1949 | Tyson | 328/146 |
| 3,016,465 | 1/1962 | Devol et al. | 307/413 |
| 3,089,097 | 5/1963 | Bell | 330/9 |
| 3,124,767 | 3/1964 | Pospischil | 332/172 |
| 3,204,117 | 8/1965 | Wood | 307/413 |
| 3,393,382 | 7/1968 | Myers | 332/178 |
| 3,577,074 | 5/1971 | Praglin | 324/98 |
| 3,609,414 | 9/1971 | Pleshko et al. | 307/310 |
| 3,686,517 | 8/1972 | Sexton, Jr. | 307/310 |
| 3,760,199 | 9/1973 | Graeme | 307/216.1 |
| 3,995,174 | 11/1976 | Zrudsky | 307/240 |
| 4,074,076 | 2/1978 | Zrudsky | 370/113 |
| 4,083,237 | 4/1978 | Levesque | 340/870.35 |
| 4,202,025 | 5/1980 | Le Cardonnel | 307/310 |
| 4,322,724 | 3/1982 | Grudzinski | 340/595 |
| 4,413,239 | 11/1983 | Romeo et al. | 332/168 |
| 4,628,256 | 12/1986 | Powell | 324/95 |
| 4,716,356 | 12/1987 | Vyne et al. | 323/312 |

FOREIGN PATENT DOCUMENTS

| | | | |
|---|---|---|---|
| 630721 | 9/1978 | U.S.S.R. | |
| 789829 | 12/1980 | U.S.S.R. | |
| 1320669 | 6/1987 | U.S.S.R. | 374/10 |

OTHER PUBLICATIONS

R. C. Jaeger, "Temperature Sensor", 9/79, pp. 1346-1347, IBM Technical Disclosure Bulletin.

Primary Examiner—Donald J. Yusko
Assistant Examiner—Yuk H. Lau
Attorney, Agent, or Firm—Raymond E. Smiley

[57] ABSTRACT

A circuit which converts one parameter to another such as from temperature to electricity. The circuit comprises a three winding differential transformer with one winding connected to output terminals and each end of the other windings connected to a source (or drain) of a different one of four field effect transistors. The circuit is adapted for receiving an alternating current source to be coupled between drains (or sources) of the transistors connected to one end of each winding and the drains (or sources) of the other transistors. A temperature measuring device and reference temperature measuring device are connected to respective ones of two of the transistors to set the current limits of the transistors as a function of temperature. A voltage produced at the output terminals, when the alternating current source is applied, is proportional to the difference in temperature of the temperature measuring devices.

11 Claims, 3 Drawing Sheets

SIGNAL CONVERTER CIRCUIT

BACKGROUND OF THE INVENTION

1. Field of Invention

The present invention is concerned with a signal converter circuit, and more particularly, with a signal converter circuit which converts one parameter to another while providing amplification.

2. Background of Invention

There is a need for a circuit which can generate an electrical signal which is proportional to some physical parameter, such as temperature, which electrical signal can be translated some distance from a remote and perhaps radiationally hostile location to a more desirable location. For example, the remote location may be at the extended end of a manipulator arm in a spacecraft and/or inside the reactor of a nuclear power plant. Previously, thermocouples have been used in conjunction with high gain linear amplifiers in which, undesirably, the amplifier offset drift is indistinguishable from the thermocouple EMF. These amplifiers are not suitable for use in harsh environments. Furthermore, thermocouples are not compatible with the use of bridge circuits and alternating current excitation techniques which could, desirably, minimize some of the unwanted direct current effects, such as amplifier offsets and thermoelectric effects.

SUMMARY OF THE INVENTION

A circuit for producing an output electrical signal proportional to the difference between a temperature of interest and a reference temperature. The circuit comprises, in combination, a three winding differential transformer, four field effect transistors (FET) and first and second means for measuring temperature.

The differential transformer has first, second and third windings, each of the windings having first and second ends. The first, second, third and fourth field effect transistors (FET) each have a drain terminal, a source terminal and a gate terminal. One of the drain and source terminals of the first FET is coupled to the first winding first end. One of said drain and source terminals of the second FET is coupled to the second winding first end. One of the drain and source terminals of the third FET is coupled to the first winding second end, and one of the drain and source terminals of the fourth FET is coupled to the second winding second end. The other of the drain and source terminals of the first and second FET's and gate terminals of the first and second FET's are coupled together and to a terminal adapted to receive a source of alternating current. The other of the drain and source terminals of the third and fourth FET's are coupled to a circuit reference terminal.

The first means has first and second terminals for measuring a temperature of interest and has a parameter at the first means terminals which is a function of temperature. The first means terminals are coupled between the circuit reference terminal and one of the third FET gate and the source or drain terminal is coupled to the reference terminal for setting a current limit of the third FET as a function of the temperature of interest.

The second means has first and second terminals for measuring a reference temperature and has a parameter at the second means terminals which is a function of temperature. The second means terminals are coupled between the circuit reference terminal and one of the fourth FET gate and source or drain terminal is coupled to the circuit terminal for setting a current limit of the fourth FET as a function of the reference temperature.

The third winding first and second terminals are coupled to the output terminals.

When an alternating signal is received by the circuit, the output signal from the third winding is proportional to the difference in temperature between the temperature of interest and reference temperature.

DETAILED DESCRIPTION

Figure 1:
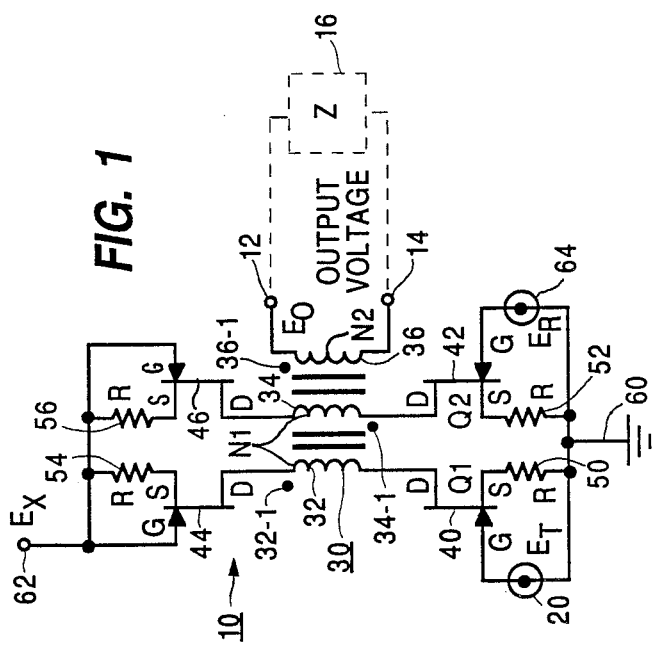
FIG. 1 is a signal converter circuit utilizing a thermocoupler sensor in accordance with a preferred embodiment of the present invention.

Referring first to FIG. 1, the purpose of the circuit 10 illustrated therein is to generate an electrical signal at output terminals 12 and 14 which is proportional to the temperature at a thermocouple junction 20, has a reliable gain and can be translated from a hostile environment in which the circuit is located to a more desirable location.

Central to the circuit of FIG. 1 is a three-winding differential transformer 30 comprising a first winding 32 having N1 turns, and oppositely wound second winding 34 also typically having N1 turns, and a third winding 36 having N2 turns which third winding may be wound either way relative to windings 32 and 34. All winding directions are as indicated by dots 32-1, 34-1, and 36-1. A typical number for N1 is 10 turns; a typical number for N2 is 100 turns. The transformer must be designed to operate at the frequency of an excitation voltage $E_x$ to be hereinafter discussed and it should have a saturation level higher than the operating flux generated by currents supplied by junction field effect transistors (JFET's) to be hereinafter discussed. The purpose of transformer 30 is to provide signal amplification. The ends of winding 36 are connected, respectively, to output terminals 12 and 14 which are, in turn, coupled to load 16 (shown in phantom) having impedance Z. Typically, the output current, $I_z$, flowing in the load Z is related to the differences of the currents (I32-I34) flowing in winding 32 and winding 34, as follows:

$$I_z = (I32 - I34) \times N1/N2 \quad (1)$$

Therefore, the output current is amplified by the turns ratio N1/N2. In practice, this ratio is limited by the internal losses in the transformer and can be optimized by careful transformer design.

Four JFET's are coupled to transformer 30 as follows. The drains (or sources since the drains and sources are typically interchangeable) of transistors 40 and 42 are coupled, respectively, to one end of transformer windings 32 and 34, while the other two transistors 44 and 46 are coupled to the opposite ends of windings 32 and 34, respectively. The sources (or drains) of transistors 40 and 42 are resistively coupled through feedback resistors 50 and 52, respectively, each of resistance R, to circuit ground 60, while the sources (or drains) of transistors 44 and 46 are resistively coupled to terminal 62 via feedback resistors 54 and 56, respectively, each of resistance R. The gates of transistors 44 and 46 are also coupled directly to terminal 62. An excitation voltage $E_x$, to be hereinafter discussed, is connected between terminal 62 and circuit ground at 60.

An exemplary JFET is a 2N4416 manufactured by a number of manufacturers including Intersil.

Exemplary values of R range from 10 to 1000 ohms. An R of 10 ohms results in less feedback and therefore higher circuit performance from the JFET's which is good in a nonradiation environment. However, in a high radiation environment high JFET performance is undesirable because the radiation degrades the performance. Thus in a high radiation environment an R of 1000 ohms is more desirable.

Remote thermocouple 20 used to measure a temperature of interest is connected between the gate of transistor 40 and signal ground 60. A local thermocouple 64 is connected between the gate of transistor 42 and circuit ground 60. Except for thermocouple 20, all circuit elements illustrated in FIG. 1 are at the same temperature.

Figure 1A:
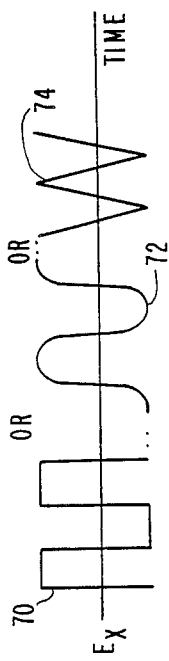
FIG. 1A is a set of alternative waveforms which may be applied to the circuit of FIG. 1.

FIG. 1A illustrates various waveforms of signal $E_x$ which can be applied to terminal 62 in FIG. 1. The main requirement of the waveform is that it alternate to positive and negative potential amplitudes with time, to act as a carrier signal which is to be modulated by the thermocouple signal in circuit 10. An exemplary peak voltage is ±20 volts; an exemplary frequency is 100 kHz. As illustrated in FIG. 1A, the waveform may be square as indicated by call-out 70, sinusoidal as indicated by call-out 72, or triangular as indicated by call-out 74.

Operation of the FIG. 1 circuit is as follows. $E_T$, the voltage produced by thermocouple 20 is a function of the temperature of thermocouple 20. Thermocouple 20 is appropriately located to measure the temperature of interest such as, for example, reactor coolant temperature. Voltage $E_T$ sets the current limit of JFET 40. In other words, the current limit varies in proportion to the value of $E_T$.

Thermocouple 64 is located in the same thermal conditions as the rest of circuit 10 except for thermocouple 20. Voltage $E_R$ produced by thermocouple 64 itself, exclusive of the connections to the JFET gate and ground, is a function of the temperature of thermocouple 64. Note that the potential between the gate of transistor 42 and terminal 60 is always zero because the thermocouple 64 and its reference junction (its connections to circuit 10) are at the same temperature. The reason for using a thermocouple for item 64 is to keep the thermocouple material and its connections in symmetry with the thermocouple connected to the gate of transistor 40. This degree of symmetry is used to improve the immunity of circuit 10 to nuclear radiation effects (gamma and neutrons). Voltage $E_R$ sets the current limit of JFET 42. In other words, the current limit varies in proportion to the value of $E_R$. Voltage $E_X$ is the excitation voltage, which is a function of frequency, and which drives all four transistors 40, 42, 44, and 46 into their current limiting mode. When the JFET's are in the current limiting mode, the amplitude variation of $E_X$ has no effect on the output $E_O$ between terminals 12 and 14. Differential transformer 30 subtracts the magnetic flux due to the common currents in the JFET's 40, 42, 44, and 46 leaving only the flux caused by the difference between the currents due to the difference in voltage between $E_T$ and $E_R$. It will be realized that the difference in voltage between $E_T$ and $E_R$ is only caused by the difference in the temperature to which those respective thermocouples 20 and 62 are subject. The difference current is multiplied by the turns ratio $N_1/N_2$ to increase the output current and therefore output voltage across the load Z.

Thus, for any given temperature to which thermocouple 20 is subject relative to that to which thermocouple 64 is subject (and the other components in FIG. 1) output voltage $E_O$ is of a given amplitude having a frequency equal to that of signal $E_X$. As the temperature of thermocouple 20 rises, $E_T$ rises and a higher current limit is set in transistor 40 and thus the output voltage $E_O$ rises. The relationship between the temperature of thermocouple 20 and the output voltage $E_O$ is given by the formula $$E_O=(N1/N2)\times(Z/R)\times(E_T-E_R); \text{ for } R>300 \text{ ohms} \quad (2)$$

where:
$E_O$ is an approximation for reasons of simplicity (It does not account for the transconductance of the JFET's, the losses in the transformer, or the resonances in the circuit. If the resonances were optimized, the output $E_O$ would have a different relationship to the turns ratio.);

$N1/N2 = $ transformer turns ratio;

$Z/R = $ ratio of the load resistance to the feedback resistance; and $(E_T-E_R) = $ difference between the thermocouple voltages $E_T$ and $E_R$.

Figure 4:
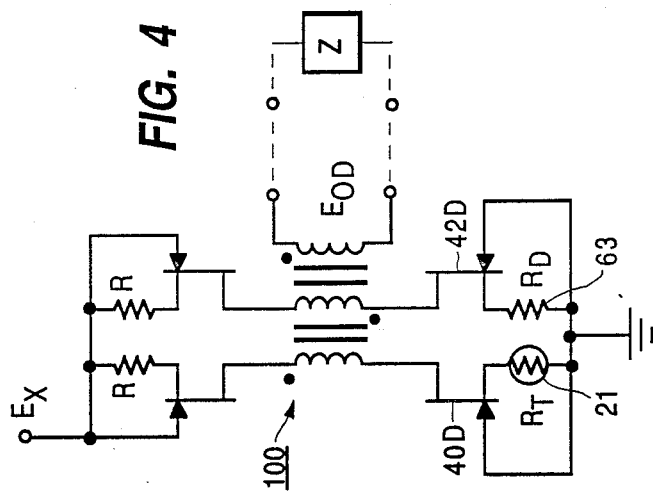
FIG. 4 is a signal converter circuit similar to that of FIG. 1 but with a different temperature sensing element.

Note that as in any thermocouple the indicated temperature is only relative to the reference junction temperature (the temperature of the measuring circuit to which it is connected) in this case the temperature of circuit 10. To measure the actual temperature of thermocouple 20, the temperature of circuit 10 must be measured by some absolute temperature measuring circuit. Such a temperature measuring circuit is as shown in FIG. 4, to be discussed hereinafter, which uses a resistance thermometer, Rt. All the components of FIG. 1 are expected to exhibit a high degree of radiation resistance, (>100 megarads of gamma rays and >$10^{14}$ neutrons/square centimeter).

Although the circuit of FIG. 1 provides reasonable signal amplification, more amplification may be desired in some circumstances. The circuit of FIG. 2, while having all of the desirable properties of the circuit of FIG. 1 in terms of being able to operate accurately in harsh environments, provides further amplification. First stage 10 is identical to circuit 10 in FIG. 1 and will not be further herein described. Stage 10A is identical to stage 10 except for three things. First, the gate of transistor 40A (which is itself identical to transistor 40) is coupled to receive the output signal $E_O$ from stage 10 rather than being coupled to a thermocouple 20 as is stage 10. Second, the gate of FET 42A (which is itself identical to transistor 42) is coupled as a short circuit to signal ground 60 rather than being coupled through a thermocouple 64 as is stage 10. Finally, the signal $E_{X1}$ while being similar to $E_X$ is of a greater frequency than $E_X$ as described in connection with FIG. 1A.

Stage 10B is identical to stage 10A, receiving between the gate of its transistor 40B and system ground 60 the output from stage 10A. Signal $E_{X2}$ being identical to the voltage applied at $E_{X1}$ except having a higher frequency than that of the voltage applied to $E_{X1}$.

Figure 2:
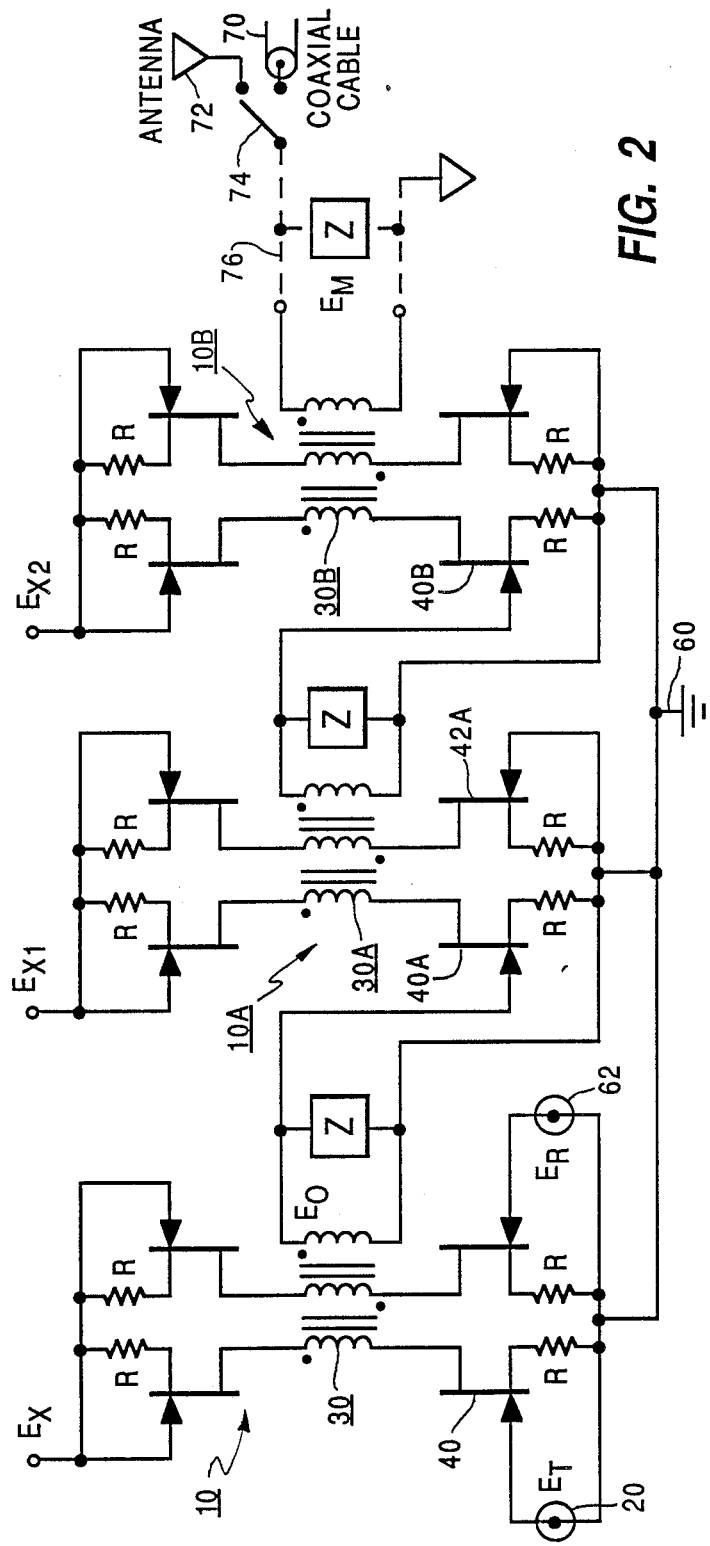
FIG. 2 is the signal converter circuit of FIG. 1 with further amplification in accordance with a preferred embodiment of the present invention.

In FIG. 2 the output of stage 10B may be coupled either to a coaxial cable 70, for example, or to an antenna 72 for broadcast to a more environmentally desirable area than the area in which the circuit of FIG. 2 is located. It should be understood that switch 74 is not in reality present but simply indicates that one of a coaxial cable 70 and antenna 72 would be chosen, not both. It should be further understood that the dashed line 76 is intended to indicate that other stages such as 10A and 10B could be utilized, if more amplification than that provided by the circuit of FIG. 2 is desired. Since the output $E_M$ is isolated by transformer coupling, its ground connection can be introduced to the ground connection of the following system (not shown) without affecting the ground at 60. Otherwise, it can be connected to ground 60. The output signal at $E_M$ relative to the voltage present in thermocouple 20 is defined by the following formula:

$$E_M = [E_O/(E_T - E_R)]^2 \times [E_O](3) ps$$

where it is assumed that all transformers have the same turns ratio and the same load and feedback resistances. The circuit of FIG. 2 operates in a manner virtually identical to that of FIG. 1 in which each circuit section 10A and 10B are receptive at their respective transistors 40 of a voltage acting to limit the current of transistors 40A and 40B at different points depending on the amplitude of signal received thereat. Again, amplification is provided by transformers 30A and 30B just as amplification is provided in the original circuit of FIG. 1 by transformer 30.

Figure 3:
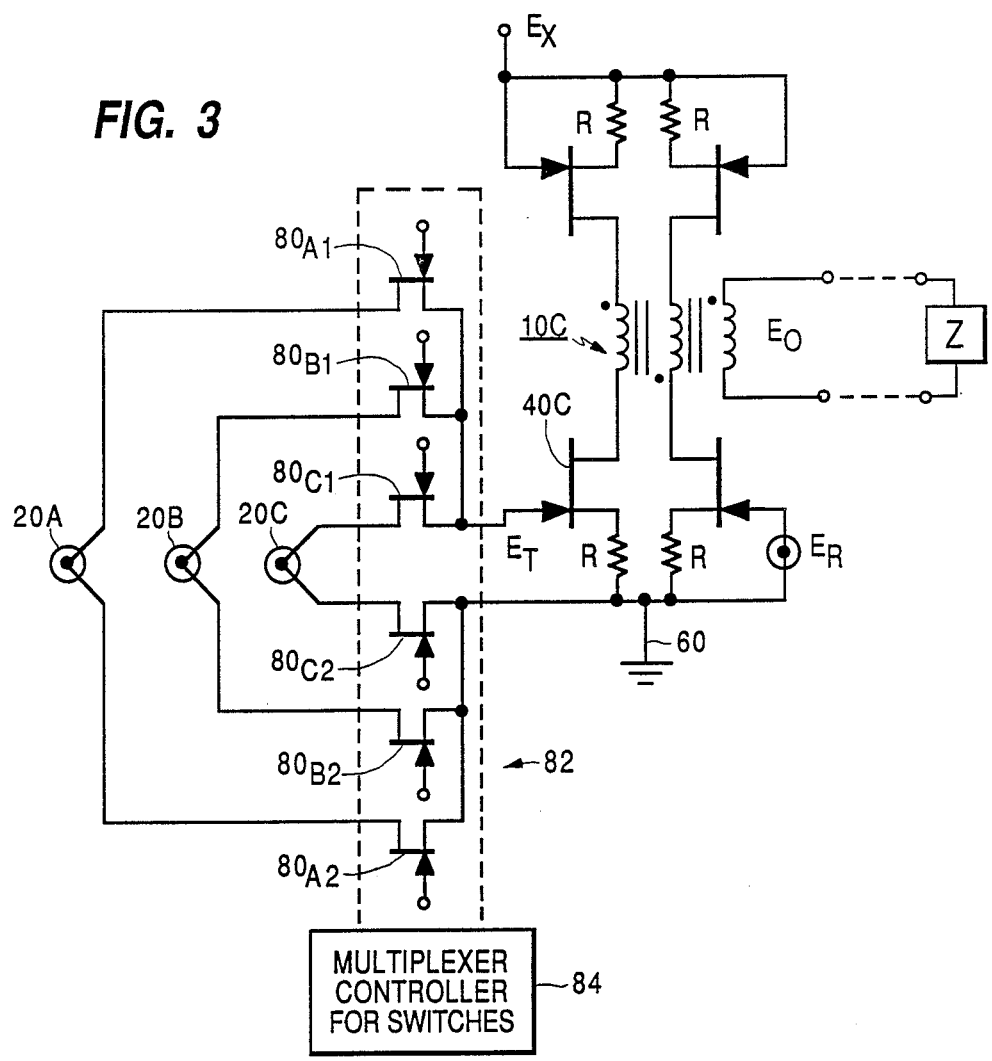
FIG. 3 is a multiplexed version of the signal converter circuit of FIG. 1.

FIG. 3 is a multiplexed version of the circuit of FIG. 1 and is generally the same as the circuit of FIG. 1 except for the presence of multiple thermocouples, three, 20A, 20B, and 20C, being illustratively shown. The output terminals of thermocouple 20A are coupled to the drains of switching JFET's $80_{A1}$, and $80_{A2}$. Similarly, thermocouple 20B is coupled to the drains of JFET's $80_{B1}$ and $80_{B2}$ while thermocouple 20C is coupled to the drains of JFET's $80_{C1}$ and $80_{C2}$, respectively. The sources of JFET's $80_{A1}$, $80_{B1}$, and $80_{C1}$ are coupled to the gate of JFET 40C corresponding to JFET 40 in FIG. 1. The sources of JFET's $80_{A2}$, $80_{B2}$, and $80_{C2}$ are coupled to system ground 60. Transistors $80_{A1}$, $80_{B1}$, $80_{C1}$, $80_{A2}$, $80_{B2}$, and $80_{C2}$ are part of a multiplexer 82.

The multiplexer 82 includes a controlling circuit 84 which sequentially turns on transistors $80_{A1}$–$80_{A2}$, $80_{B1}$–$80_{B2}$, and $80_{C1}$14 $80_{C2}$ to couple in order thermocouples 20A, 20B, and 20C between the gate of JFET 40C and circuit ground 60. It should be noted that the actual connections between multiplex controller 84 and the gates of the various JFET transistors 80 are not shown for the sake of drawing clarity. In other respects, the operation of the circuit of FIG. 3 is identical to that of FIG. 1. Again, because of the nature of all of the components utilized in FIG. 3 and particularly the use of JFET transistors, the circuit is more easily radiation hardened than using CMOS or other semiconductors. The frequency with which the various transistor switches are turned on is a much lower frequency than the frequency of the signal $E_X$ illustrated in FIG. 1A. The sampling frequency of the thermocouples is required to be at least twice the frequency bandwidth of the thermocouple signal, to include all the information available. As the sampling frequency increases the frequency spectral content in the signal $E_O$ increases and would require wider bandwidths in the succeeding stages. This wider bandwidth decreases the signal-to-noise ratio at the output which is undesirable.

FIG. 4, to which attention is now directed, is identical to the circuit of FIG. 1 except for the substitution of a resistance thermometer 21 in place of the thermocouple 20 illustrated in FIG. 1. Due to the nature of the operation of a resistance thermometer relative to that of a thermocouple, there is a slight change in circuit connection with regard to JFET's 40D and 42D relative to JFET's 40 and 42 of FIG. 1. The JFET's themselves are identical to JFET's 40 and 42 in FIG. 1. Thus, the resistance thermometer 21 is connected between the source of JFET 40D and circuit ground 60. Similarly, a dummy thermometer 63 is connected between the source (or drain) of JFET 42D and circuit ground 60, while the gate of JFET 42D is connected directly to circuit ground 60. The current limiting voltage $V_{G-S}$ of JFET 40D, for example, is the voltage between the gate and the source. Therefore, the resistance thermometer 21 voltage drop is the current limiting voltage at the JFET's. In fact, it is:

$$V_{G-S} = (E_{gate} - E_{ground}) - (E_{source} - E_{ground})(4)$$

Therefore, the current limiting voltage for the resistance thermometer is just $(E_{source} - E_{ground})$, and since this is the voltage across the thermometer resistor $R_T$ the current limiting voltage varies with the resistance of $R_T$, which varies with temperature. In all other respects the operation of the circuit of FIG. 4 is identical to the operation of the circuit in FIG. 1. It should be understood that the output $E_{OD}$ of circuit 10D in FIG. 4 can be coupled in place of circuit 10 in FIG. 2, for example.

Although the circuit has been described with the use of junction field effect transistors, other field effect transistor types will work. However, in the case of necessity to work in a radiation environment, the junction field effect transistor provides the best results. That is, the most accurate output with regard to changes in temperature at the thermocouple or resistance thermometer.

What is claimed is:

1. A circuit for producing an output electrical signal proportional to the difference between a temperature of interest and a reference temperature, said circuit comprising in combination:

a differential transformer having first, second and third windings, each of said windings having first and second ends;

first, second, third and fourth field effect transistors (FET) each having a drain terminal, a source terminal and a gate terminal, one of the drain and source terminals of said first FET being coupled to said first winding first end, one of said drain and source terminals of said second FET being coupled to said second winding first end, one of said drain and source terminals of said third FET being coupled to said first winding second end, and one of said drain and source terminals of said fourth FET being coupled to said second winding second end, the other of said drain and source terminals of said first and second FET's being impedance coupled to a first circuit reference terminal adapted to receive a source of alternating current, said gate terminals of said first and second FET's being coupled to said first circuit reference terminal, the other of said drain and source terminals of said third and fourth FET's being impedance coupled to a second circuit reference terminal;

first means having first and second terminals for measuring a temperature of interest and having a parameter at said first means terminals which is a function of temperature, said first means terminals being coupled between said second circuit reference terminal and said third FET gate for setting a current limit of said third FET as a function of said temperature of interest; and second means having first and second terminals for measuring a reference temperature and having a parameter at said second means terminals which is a function of temperature, said second means terminals being coupled between said second circuit reference terminal and said fourth FET gate for setting a current limit of said fourth FET as a function of said reference temperature;

said third winding first and second terminals being coupled to said output terminals, whereby when an alternating signal is received by said circuit, the output signal from said third winding is proportional to the difference in temperature between said temperature of interest and reference temperature.

2. The circuit as set forth in claim 1 wherein said transformer first and second windings are oppositely wound.

3. A combination as set forth is claim 1 wherein said first and second means for measuring temperature are thermocouples.

4. The combination as set forth in claim 1 wherein said first, second, third and fourth field effect transistors are junction field effect transistors.

5. The combination as set forth in claim 3 and further including:

a second differential transformer having first, second and third windings, each of said windings having first and second ends;

fifth, sixth, seventh and eighth field effect transistors (FET) each having a drain terminal, a source terminal and a gate terminal, one of the drain and source terminals of said fifth FET being coupled to said first winding first end of said second transformer, one of said drain and source terminals of said sixth FET being coupled to said second winding first end of said second transformer, one of said drain and source terminals of said seventh FET being coupled to said first winding second end of said second transformer, and one of said drain and source terminals of said eighth FET being coupled to said second winding second end of said second transformer, the other of said drain and source terminals of said fifth and sixth FET's being impedance coupled to a third reference terminal adapted to receive a second source of alternating current, said gate terminals of said fifth and sixth FET's being coupled to said third reference terminal, the other of said drain and source terminals of said seventh and eighth FET's being impedance coupled to said second circuit reference terminal and the gate of said eighth FET being coupled to said second circuit reference terminal;

said first and second ends of said third winding of said a differential transformer being coupled between said gate of said seventh FET and said second circuit reference terminal, said third winding first and second terminals of said second transformer being coupled to said output terminals.

6. The combination as set forth in claim 5 wherein said fifth, sixth, seventh and eight field effect transistors are junction field effect transistors.

7. A circuit for producing an output electrical signal proportional to the difference between a temperature of interest and a reference temperature, said circuit comprising in combination:

a differential transformer having first, second and third windings, each of said windings having first and second ends;

first, second, third and fourth field effect transistors (FET) each having a drain terminal, a source terminal and a gate terminal, one of the drain and source terminals of said first FET being coupled to said first winding first end, one of said drain and source terminals of said second FET being coupled to said second winding first end, one of said drain and source terminals of said third FET being coupled to said first winding source end, and one of said drain and source terminals of said fourth FET being coupled to said second winding second end, the other of said drain and source terminals of said first and second FET's being impedance coupled to a first circuit reference terminal adapted to receive a source of alternating current, said gate terminals of said first and second FET's being coupled to said first circuit reference terminal, said gate terminals of said third and fourth FET's being impedance coupled to a second circuit reference terminal;

first means having first and second terminals for measuring a temperature of interest and having a parameter at said first means terminals which is a function of temperature, said first means terminals being coupled between said second circuit reference terminal and the other of said source or drain terminal of said third FET for setting a current limit of said third FET as a function of said temperature of interest; and second means having first and second terminals for measuring a reference temperature and having a parameter at said second means terminals which is a function of temperature, said second means terminals being coupled between said second circuit reference terminal and the other of said source or drain terminal of said fourth FET for setting a current limit of said fourth FET as a function of said reference temperature;

said third winding first and second terminals being coupled to said output terminals, whereby when an alternating signal is received by said circuit, the output signal from said third winding is proportional to the difference in temperature between said temperature of interest and reference temperature.

8. The combination as set forth in claim 7 wherein said second means is a thermocouple coupled between said gate FET and said second circuit reference terminal and wherein said first means is a plurality of thermocouples, each of which has one terminal coupled to said second circuit reference terminal and each of which has a second terminal selectively coupled to said gate of said third FET, selection being such that only one of said plurality of thermocouples at a time is connected thereto.

9. The combination as set forth in claim 8 wherein said first, second, third and fourth field effect transistors are junction field effect transistors.

10. The combination as set forth in claim 7 wherein said first and second means for measuring temperature are resistance thermometers coupled between the other of one of the source and drain of said third and fourth FET's respectively and said circuit reference terminal and wherein said gates of said third and fourth FET's are connected to said circuit reference terminal.

11. The combination as set forth in claim 10 wherein said first, second, third and fourth field effect transistors are junction field effect transistors.

* * * * *